(12) United States Patent
Menichelli et al.

(10) Patent No.: US 6,259,631 B1
(45) Date of Patent: Jul. 10, 2001

(54) ROW DRIVE CIRCUIT EQUIPPED WITH FEEDBACK TRANSISTORS FOR LOW VOLTAGE FLASH EEPROM MEMORIES

(75) Inventors: Stefano Menichelli, Avezzano; Tommaso Vali, Sezze, both of (IT)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/368,703

(22) Filed: Aug. 5, 1999

Related U.S. Application Data
(60) Provisional application No. 60/102,270, filed on Sep. 29, 1998.

(30) Foreign Application Priority Data

Sep. 13, 1996 (IT) ...................................... RM 96A 000 626

(51) Int. Cl.[7] .............................. G11C 16/12; G11C 16/14
(52) U.S. Cl. ................................ 365/185.23; 365/185.33
(58) Field of Search ........................... 365/185.23, 185.33

(56) References Cited

U.S. PATENT DOCUMENTS

| | | | |
|---|---|---|---|
| 4,956,816 | * 9/1990 | Atsumi et al. | 365/185.22 |
| 4,999,813 | * 3/1991 | Ohtsuka et al. | 365/185.18 |
| 5,455,789 | 10/1995 | Nakamura et al. | 365/185.17 |

FOREIGN PATENT DOCUMENTS

0356650 A2   3/1990   (EP) .............................. G11C/17/00

* cited by examiner

Primary Examiner—Andrew Q. Tran
(74) Attorney, Agent, or Firm—Bret J. Petersen; Frederick J. Telecky, Jr.

(57) ABSTRACT

A voltage translator circuit for driving the rows or wordlines of Flash EEPROM memories, having control logic voltages in the range 0 to 3.3 volts, as well as operating voltages needed for reading, programming or erasing operations in the range −9 to 12 volts. The voltage translator circuit includes a first feedback transistor (TP4), the gate of which (node 18) is directly driven by the wordline, and a second feedback transistor (TN5), the gate of which is also driven by the wordline (node 18), inserted between the connection node (node 6) between the first feedback transistor (TP4) and the gate region of a first switch transistor (pull-up 3) and the input node (node 0) on the gate region of a second switch transistor (pull-down 2).

6 Claims, 3 Drawing Sheets

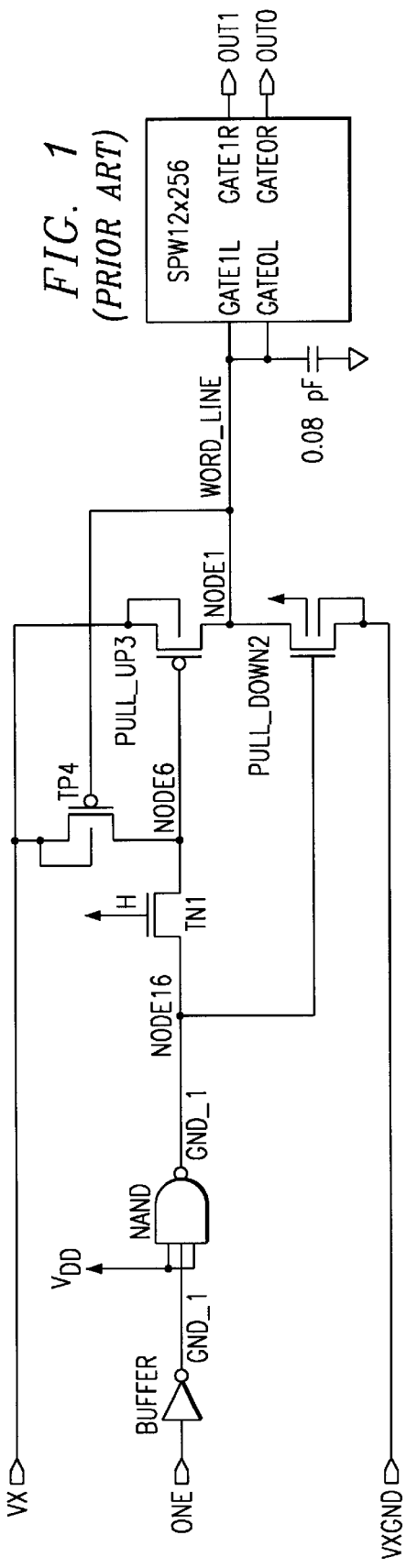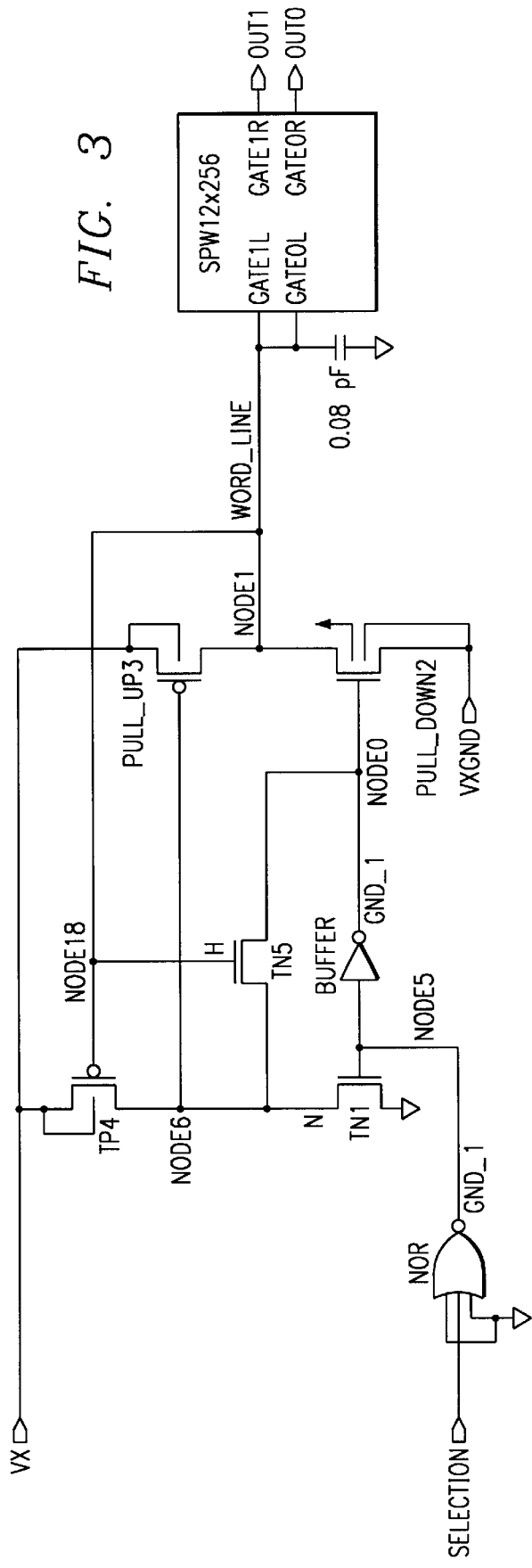

ROW DRIVE CIRCUIT EQUIPPED WITH FEEDBACK TRANSISTORS FOR LOW VOLTAGE FLASH EEPROM MEMORIES

This Appln claims benefit of Provisional Appln No. 60/102,270 Sep. 29, 1998.

FIELD OF THE INVENTION

This invention broadly relates to drive circuits for semiconductor memories and more particularly concerns a row drive circuit for low voltage Flash EEPROM memories.

BACKGROUND

As it is known, in implementing memory circuits, particularly Flash EEPROM memories, a problem is raised in connection with the simultaneous existence within the circuit of logic signals as well as of signals variable within an extended voltage range and consequently with the need of simultaneous management of them. Such variable signals within an extended voltage range are intended to be used in the various operation modes of the memory, such as the read or programming or erasure operations. The logic signals, on the other hand, are control signals and are variable between ground voltage, as indicated by GND, and the supply voltage, as indicated by VDD. The normal supply voltage in these circuits, which are also designated as low voltage or low power circuits, is presently of about 3.3 volts, while the voltage used for performing operations such as internal programming or erasure operations can also reach 12 volts (for instance, 5 volts for read operations).

On the one side, this entails the need to implement various circuits on the chip to generate such higher voltages starting from the low supply voltage of 3.3 volts, and, on the other side, this entails the need to implement suitable circuits within the memory itself adapted to handle or manage these voltages higher than the supply voltage, without introducing time delays incompatible with a proper operation of the memory and consequently without affecting its access times. The essential requirement of these circuits, therefore, is related to their operation speed: these circuits are defined as voltage translators.

SUMMARY OF THE INVENTION

This invention is not aimed at generating such operation voltages higher than the supply voltage, but it is an object thereof to handle these voltages in very fast manner, while also a space saving is achieved on the silicon area.

More precisely, it is an object of this invention to provide a voltage translator circuit which, even if logic signals in a voltage range of 0 to 3.3 volts are applied to its input port and even if voltages in the range of −9 to 12 volts as generated by other suitable circuits are available thereto, is adapted to furnish output voltages fully variable within the latter range and also adapted to operate in very fast manner; in the same time such circuit ought to need a small silicon area for implementation.

Since the read time of a memory is a substantial feature thereof and since all read operations require a voltage higher than the supply voltage, the main but, of course, not exclusive application of this invention is to be identified in a row drive circuit for Flash EEPROM memories, by operating as a voltage translator circuit designed to couple such above mentioned read voltages to selected rows or wordlines of the memory.

Summarising all above said, in present Flash EEPROM memory technology with a supply voltage of 3.3 volts, the read operation are carried out by driving the selected wordline to 5 volts and all not-selected wordlines to ground GND. When other operations are to be carried out, such as programming or erasure operations, the concerned wordlines should be driven to other voltages, typically in the range −9 volts to 12 volts. High voltage transistors should be used, therefore, in said row drive circuits, in order to accommodate these voltages noticeably higher than the supply voltage. In P-channel or N-channel MOS transistor technology, said high voltage transistors offer rather poor performances with respect to low voltage transistors, as it is well known to those skilled in the art, due to the noticeable thickness of the required gate oxide. This is really the core of the problem, since in very fast applications, such as the above mentioned memories, with an access time in the range of 10 to 20 nsec, the row drive circuit should drive the selected wordlines in a very fast manner, even if high voltage transistor are employed, due to the fact that any delay in coupling the wordline driving voltages directly and adversely affects the memory access time.

Starting, therefore, from a situation entailing a Flash EEPROM memory having logic control voltages in the range of 0 to 3.3 volts as well as operation voltages (VX) for effecting read, programming or erasure operations in the range of −9 to 12 volts and comprising a decode section schematically represented as a NOR gate circuit which receives the selection signals coupled to an input node to an inverter circuit, it is specific subject-matter of this invention to provide a voltage translator circuit to drive the rows or wordlines of a memory, wherein:

the wordline to be driven is connected to ground through a first N-MOS type switch transistor, the gate of which is driven by the selection logic signal applied through said NOR gate circuit and said inverter circuit and it is connected to the operation voltage through a second P-MOS type switch transistor, a first P-MOS type feedback transistor, the gate of which is directly driven by said wordline, is inserted between the operation voltage and the gate region of said second switch transistor, a second N-MOS type feedback transistor, the gate of which is directly driven by said wordline, is inserted between the connection node of said first feedback transistor with the gate region of said second switch transistor and the input node on the gate region of said first switch transistor.

In the preferred embodiment, the connection node between said first feedback transistor and the gate region of said second switch transistor is connected to ground through a decoupling transistor of N-MOS type, the gate of which is driven by the selection signal once inverted and coming from the connection node between said NOR gate circuit and said inverter circuit.

BRIEF DESCRIPTION OF THE DRAWINGS

Further details and advantages of this invention will be evident from the following specification by referring to the enclosed drawings wherein the preferred embodiment is shown by way of illustration and not by way of limitation.

In the drawings:

FIG. 1 shows a diagram of a conventional row drive circuit,

FIG. 3 shows a diagram of a row drive circuit according to this invention.

DETAILED DESCRIPTION

Figure 2:
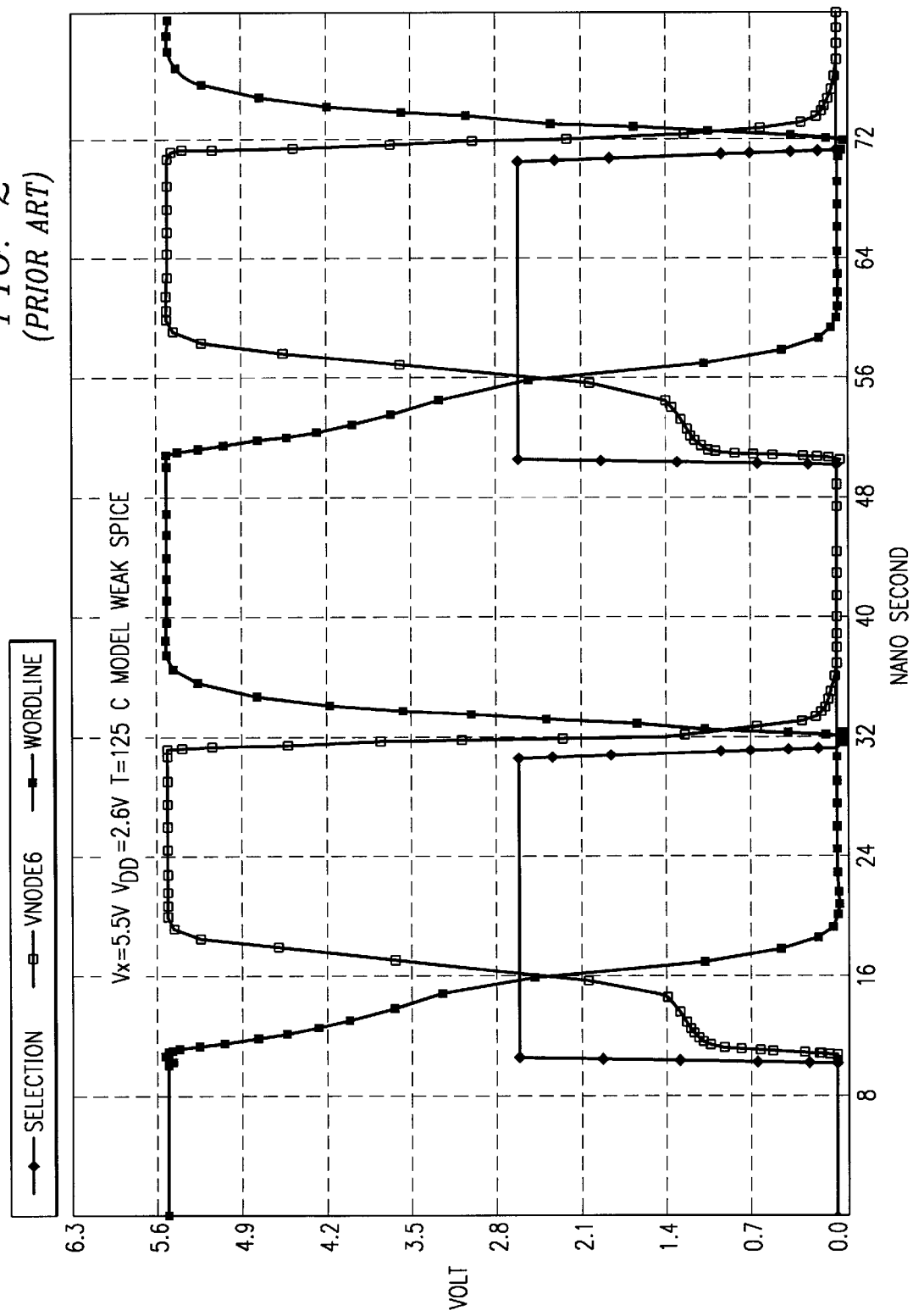
FIG. 2 is a waveform diagram of the meaningful voltages in the circuit of FIG. 1.

The operation of a conventional circuit will be now explained by referring to FIGS. 1 and 2.

It should be preliminarily underlined that the inverter circuit BUFF and the NAND gate circuit of FIG. 1 should not be considered as real and individual components of the circuit we are now discussing, but they are rather symbolically indicated as representatives of the pre-existing row decode section and are shown only for explanation clarity purposes. A further specification relates to the fact that VX and VXGND generically designate the operation voltage and the ground voltage to be translated to the concerned wordline.

In the circuit we are examining, the wordline is connected through node 1 to voltage VX and to ground VXGND, respectively, by means of a P-channel transistor pull-up 3 and a N-channel transistor pull-down 2, effectively operating as switches. The gate region of transistor pull-down 2 is connected to input node 16, while the gate region of transistor pull-up 3 is connected to node 6. A feedback P-channel transistor TP4 is inserted between the operation voltage VX and the gate region of transistor pull-up 3, on node 6. The gate region of feedback transistor TP4 is directly driven by the wordline.

The operation is as follows. When a selection signal having a logic value 1 in available on the input lead, it will be inverted to a 0 value by inverter circuit BUFF and again inverted to a 1 value by the NAND gate circuit, on node 6. This signal, which is a low voltage signal because it is a logic signal, turns on transistor pull-down 2, that, upon turning on, takes node 1 and consequently the related wordline to ground VXGND. This lowered wordline voltage is transferred to the gate region of feedback transistor TP4 which will be turned on. Since transistor TP4 is inserted between voltage VX and the gate region of transistor pull-up 3 through node 6, transistor TP4 upon turning on will raise the voltage on node 6 to VX, with the resulting consequence that transistor pull-up 3 will be completely turned off. In this manner, the wordline is perfectly connected to VXGND through transistor pull-down 2 which is on and it is perfectly insulated from voltage VX by means of transistor pull-up 3 which is off.

In order to prevent the high voltage VX from affecting the logic section of the circuit, which is at low voltage, a decoupling transistor TN1 is inserted between node 6 and node 16.

All above-mentioned transistors are of high voltage type, as indicated by literal designation H in the drawing.

The need to use a feedback transistor TP4 is due to the fact that the logic voltage available on node 6 and consequently on gate region of transistor pull-up 3 would not be sufficient to turn transistor pull-up 3 off: in fact, it can be observed that it is connected to voltage VX that, in this application, is of 5 volts, and, therefore, its gate region would be at a too high voltage for it to be driven by said input logic voltage.

After having examined a starting condition wherein the concerned wordline has been lowered from voltage VX to ground VXGND, the opposite switch over action will now be analysed.

When the selection signal toggles to logic state 0, a logic state 1 will be established at the output of the inverter circuit BUFF and again a logic state 0 will be established at the output of the NAND gate circuit, on node 16. A 0 logic voltage on node 16, when applied to the gate region of transistor pull-down 2, will force the latter to turn off with consequent insulation or decoupling of the wordline from ground VXGND. In addition, this logic voltage 0 is applied though transistor TN1 and node 6 to the gate region of transistor pull-up 3 and will force it to turn on, thereby raising the wordline voltage up to VX. Since the concerned wordline is connected to the gate region of the feedback transistor TP4, as the wordline voltage is raised, the conduction capability of transistor TP4 is lowered down to the point that said transistor is turned off, which occurs when the wordline is raised just to voltage VX. When transistor TP4 is off, transistor pull-up 3 is on and the concerned wordline is directly connected to voltage VX, and the wordline is completely insulated when transistor pull-up 3 is in the off condition.

In order to improve the performances of this circuit particularly in respect of its operation speed, this invention suggests to adopt the circuit approach shown in FIG. 3.

It should be understood that the decode functions carried out by inverter circuit BUFF and by subsequent NAND gate circuit can be carried out by NOR gate circuit of FIG. 3.

It can be observed in FIG. 3 that the concerned wordline is again connected to operation voltage VX by means of a P-channel transistor pull-up 3 and to ground VXGND by means of a N-channel transistor pull-down 2. It can also be observed that a feedback transistor TP4 is provided, the gate region of which is directly driven by the wordline, inserted between voltage VX and the gate region of transistor pull-up 3, through node 6. This circuit is substantially distinguished with respect to the known circuit by means of a further N-channel feedback transistor TN5, the gate of which is again directly driven by the wordline, inserted between node 6, more precisely the gate region of transistor pull-up 3, and the gate region of transistor pull-down 2. N-channel transistor TN1 is inserted between node 6 and ground, having its gate region driven by node 5 and consequently by the same selection signal after a single inversion.

The operation takes place as follows. When the selection logic signal is at 0 level, node 5 is at 1 logic level, corresponding to the supply voltage VDD. Transistor TN1, which is driven by inverted selection signal, is turned on and forces node 6 to 0 logic level. As soon as node 6 is forced to 0 logic level, transistor pull-down 2 is turned off because the 1 logic level signal on node 5 is again inverted by inverter circuit BUFF and becomes a 0 logic level signal on node 0 and consequently on gate region of transistor pull-down 2 which is turned off.

When transistor TN5 is considered, it can be observed that a voltage of 0 volt is established on node 0 and again a voltage of 0 volt is established on node 6, as above already seen, due to the on condition of transistor TN1.

Since node 6 is at 0 level and transistor pull-down 2 is in off condition, transistor pull-up 3 will be turned on and it will cause the wordline to begin to rise to voltage VX. By rising to voltage VX, the wordline will cause the feedback transistor TP4 to be turned off through node 18. On the other hand, a higher voltage on node 18 will entail a higher voltage on the gate region of N-channel transistor TN5, but, since a 0 logic level exists both on node 6 and on node 0, namely at the ends of this transistor, the on condition of transistor TN5 will have no effect. As a final result, the concerned wordline will be raised to voltage VX and will be completely decoupled from voltage VXGND.

When a switch over operation in the opposite direction is to be carried out, when the selection signal is turned from a 0 logic level to a 1 logic level, node 5 will take up the inverted level 0 and, as a result, transistor TN1 will be turned off and will clear node 6, that is to say it will decouple it from ground voltage GND. Following a further inversion of the signal effected by inverter circuit BUFF, node 0 will turn to level 1 and it will drive the gate region of transistor pull-down 2 so as to turn it on, while the voltage on node 0 will be completely translated to node 6 through the second feed-back transistor TN5. In fact, since voltage VX resulting from the previous switch over operation is still applied to the gate region of transistor TN5 from node 18 and from the concerned wordline, transistor TN5 is still on.

The following situation is utilised in this switch over operation: the wordline is still at voltage VX and transistor TN5 is on. The signal of 0 logic level that is prevailing on node 0 not only turns transistor pull-down 2 on—and this is its main object—but it also transfers a charge of a certain amount to node 6 and in this manner it succeedes in slightly raising the voltage of node 6. As a matter of fact, node 6 rises to a level slightly higher than the lever it would reach in absence of transistor TN5. When the voltage on node 6 rises at higher rate, a double effect is obtained, namely to aid and to accelerate turning P-channel transistor pull-up 3 off, since it is connected to its gate region.

In this operation stage, the following operation pattern is established: the voltage on node 6 is rising, transistor pull-down 2 is turned on thereby aiming at lowering the wordline voltage. When the voltage is near to 0, it begins turning transistor TN5 off, but it should be observed that an initial trigger action occurs that enables the turning action on transistor pull-up 3 to be started and consequently to be advanced by a small amount, thereby reducing the transition time. Since the voltage on node 6 is rising, transistor pull-up 3 is turning off, and, therefore, the voltage of the wordline is being lowered to 0: as it gets nearer and nearer to 0, it turns the second N-channel feedback transistor TN5 off, but it also turns the first feedback transistor TN4 on, which, in turn, completes turning transistor pull-up 3 off. At this point, since transistor pull-up 3 is turned off and transistor pull-down 2 is turned on, the wordline is decoupled from voltage VX and is coupled to voltage VXGND.

The essential feature of this circuit just consists in exploiting the above described second feedback effect between node 0 and node 6: this feedback effect is assured by transistor TN5 that, in transition from 0 to 1, utilises its pre-existing conductive condition connected with the pre-existing condition of the wordline.

Figure 4:
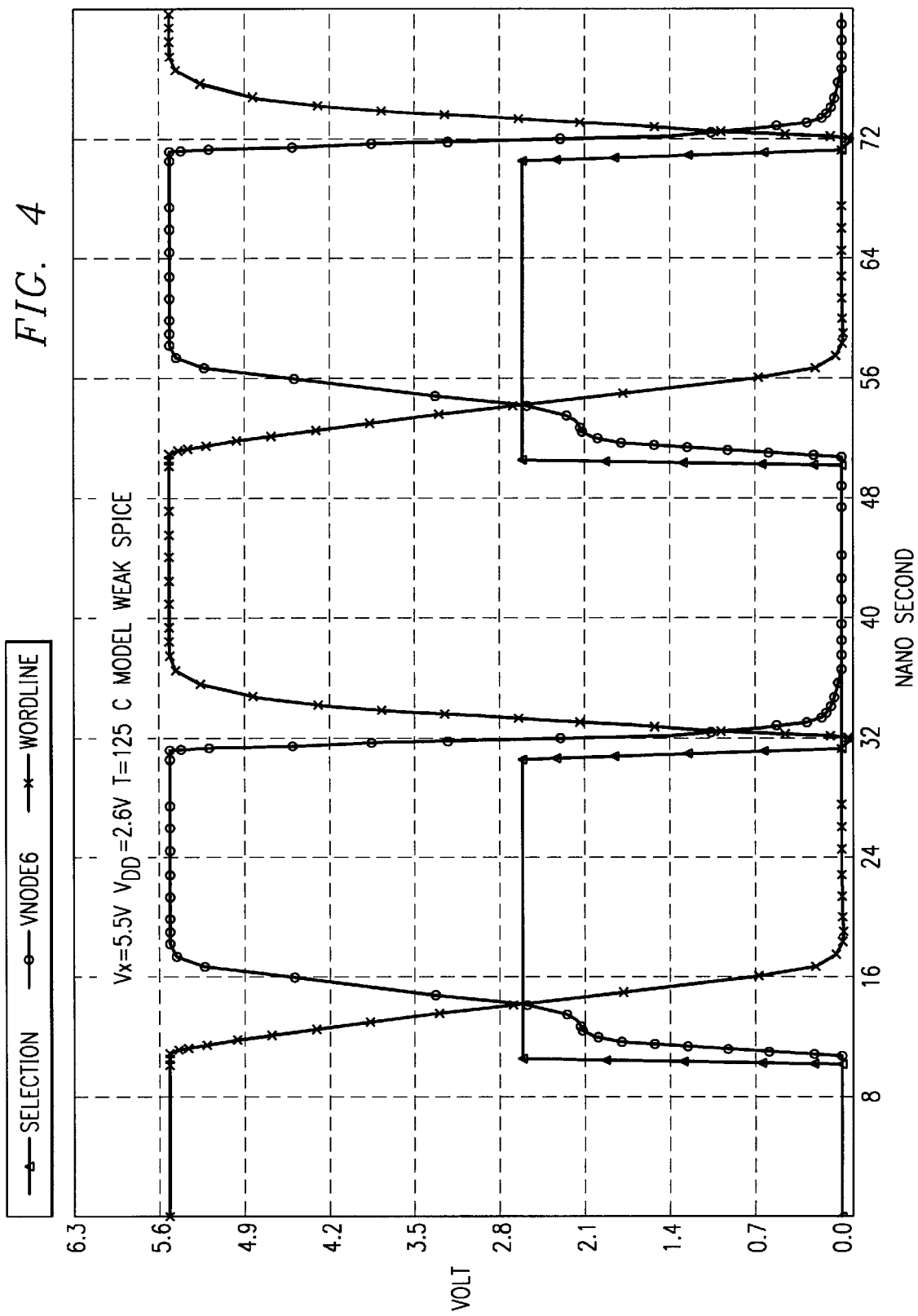
FIG. 4 is a waveform diagram of the meaning full voltage in the circuit of FIG. 3.

By referring to FIGS. 2 and 4, wherein the selection voltage behaviours on node 6 and on the wordline are shown, it is evident that the voltage on node 6 rises to a level slightly higher than level reached in a conventional circuit. A faster voltage rise time on node 6 means that transistor pull-up 3 is turned off faster and this, in turn, means a faster decrease of the wordline voltage which is decoupled from voltage VX.

In order to complete these observations, it is to be remarked that, while the first feedback effect assured by transistor TP4 is a feedback effect between the output and the input ends of the circuit, the second feedback effect is introduced and promoted directly from the input end of the circuit, since its output is only intended to pre-establish a conductive condition in transistor TN5. Transistor PN5 does not receive its control signal from the output end; but it receives such signal from the input end of the circuit, with an advance time, thereby promoting the above-defined starting effect.

The above result has been achieved at expenses of the fact that node 18 has been loaded by said transistor TN5, but this drawback, in addition to being largely counterbalanced by said starting effect, is quite tolerable, from a process view point, in view of the reduced dimensions of said transistor, which are for instance L=1.4 and W=6.

A further advantage of the approach according to this invention, connected with the substitution of a NOR gate circuit for the NAND gate circuit, is gained in reducing the silicon area needed for its implementation.

In fact, it is known that the row drive circuits in the memory topology should have the same Y dimension as the memory array. This entails that any reduction achieved in the X dimension of the circuit will result into a more relevant reduction in its comprehensive area, since such a reduction will be extended over the whole Y dimension of the circuit. Then, when it is desired to save silicon area, it is substantially important to design the concerned drive circuits with their width dimensions as much compact as possible. The difference between the conventional approach and the approach according to this invention has been investigated by adding all W values together and it has beeb found that the approach according to this invention entails a cumulative W dimension smaller than the one of a conventional approach: this means a two-fold advantage in terms of better performances with a smaller silicon area.

The preferred embodiment of this invention has been hereinbefore explained, but it should be understood that those skilled in the art can made variations and changes to the components therein without so departing from the scope of this invention.

What is claimed is:

1. A voltage translator circuit for driving the rows or wordlines of Flash EEPROM memories, having control logic voltages in the range 0 to 3.3 volts, as well as operating voltages needed for reading, programming or erasing operations in the range −9 to 12 volts, comprising:

a decode section having an input selection logic signal coupled to a first inverter circuit (NOR) connected to a second inverter circuit (BUFF) through an input node (node 5) to couple the selection signal thereto, a wordline to be driven (node 1) connected to ground operation voltage (VXGND) through a first N-MOS type switch transistor (pull-down 2) the gate of which (node 0) is driven by the selection logic signal applied through said first and second inverter circuits and connected to the operation voltage (VX) through a second P-MOS type switch transistor (pull-up 3), a first P-MOS type feedback transistor (TP4), the gate of which is directly driven by said wordline, connected between the operation voltage (VX) and the gate region (node 6) of said second switch transistor (pull-up 3), and a second N-MOS type feedback transistor (TN5), the gate of which is directly driven by said wordline (node 18), inserted between a connection node (node 6) between said first feedback transistor (TP4) and the gate region of said second switch transistor (pull-up 3) and the input node (node 0) on the gate region of said first switch transistor (pull-down 2).

2. A voltage translator circuit according to claim 1, wherein the connection node (NOD0 6) between said first feedback transistor (TP4) and the gate region of said second switch transistor (pull-up 3) is connected to ground power supply voltage (GND) through a decoupling transistor (TN1) of N-MOS type, the gate of which is driven by the selection signal once inverted and coming from the connection node (node 5) between said first inverter circuit and said second inverter circuit (BUFF).

3. A voltage translator circuit according to claim 2, wherein said switch transistors (pull-up 3, pulldown 2), said feedback transistors (TP4, TN5) and said decoupling transistor (TN1) are high voltage (H) transistors.

4. A voltage translator circuit for driving the rows or wordlines of Flash EEPROM memories, comprising:

- a wordline connected to a ground operation voltage through a first N-MOS type switch transistor and connected to the operation voltage through a second P-MOS type switch transistor,
- a first feedback transistor, the gate of which is driven by said wordline, connected between the operation voltage and the gate region of said second switch transistor,
- a second feedback transistor, the gate of which is driven by said wordline, connected between a connection node between said first feedback transistor (TP4) and the gate region of said second switch transistor and the input node on the gate region of said first switch transistor.

5. A voltage translator circuit according to claim 4, wherein the connection node between said first feedback transistor and the gate region of said second switch transistor is connected to a ground power supply voltage through a decoupling transistor of N-MOS type, the gate of which is driven by a selection signal once inverted and coming from the connection node between a NOR gate circuit and an inverter circuit.

6. A voltage translator circuit according to claim 5, wherein said switch transistors, said feedback transistors and said decoupling transistor are high voltage transistors.

* * * * *